(12) United States Patent
Izumida et al.

(10) Patent No.: US 8,258,562 B2
(45) Date of Patent: Sep. 4, 2012

(54) SEMICONDUCTOR DEVICE HAVING TRI-GATE STRUCTURE AND MANUFACTURING METHOD THEREOF

(75) Inventors: Takashi Izumida, Yokohama (JP);
Takahisa Kanemura, Yokohama (JP);
Nobutoshi Aoki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 426 days.

(21) Appl. No.: 12/470,030

(22) Filed: May 21, 2009

(65) Prior Publication Data

US 2009/0289293 A1    Nov. 26, 2009

(30) Foreign Application Priority Data

May 22, 2008 (JP) ................................. 2008-134580

(51) Int. Cl.
*H01L 29/76* (2006.01)
(52) U.S. Cl. ............... 257/314; 257/E29.264; 257/E29.3
(58) Field of Classification Search .................. 257/510, 257/E21.546, 296, 314–346, 347, 623, E29.264, 257/E29.3, E21.68, E21.681, E21.69, E21.209, 257/E21.21; 438/593
See application file for complete search history.

(56) References Cited

U.S. PATENT DOCUMENTS

| | | | |
|---|---|---|---|
| 5,889,304 A * | 3/1999 | Watanabe et al. ............. 257/321 |
| 6,403,421 B1 * | 6/2002 | Ikeda et al. ..................... 438/267 |
| 6,767,813 B2 * | 7/2004 | Lee et al. ........................ 438/585 |
| 6,894,930 B2 * | 5/2005 | Chien et al. ............. 365/185.17 |
| 6,969,884 B2 * | 11/2005 | Kitamura et al. ............. 257/315 |
| 7,012,295 B2 | 3/2006 | Sato et al. |
| 7,122,430 B2 | 10/2006 | Sato et al. |
| 7,170,786 B2 * | 1/2007 | Chien et al. ............. 365/185.17 |
| 7,196,370 B2 * | 3/2007 | Kai et al. ....................... 257/315 |
| 7,384,843 B2 * | 6/2008 | Kim et al. ...................... 438/257 |
| 7,491,998 B2 * | 2/2009 | Chang et al. .................. 257/314 |
| 7,534,686 B2 * | 5/2009 | Lee et al. ....................... 438/283 |
| 7,557,042 B2 * | 7/2009 | Li et al. .......................... 438/696 |
| 7,687,361 B2 * | 3/2010 | Jang et al. ..................... 438/294 |
| 7,888,208 B2 * | 2/2011 | Sheen et al. .................. 438/264 |
| 7,968,399 B2 * | 6/2011 | Kitamura et al. ............. 438/211 |
| 2002/0179962 A1 * | 12/2002 | Kinoshita ...................... 257/315 |
| 2004/0099900 A1 * | 5/2004 | Iguchi et al. .................. 257/315 |
| 2005/0047261 A1 * | 3/2005 | Kai et al. ....................... 365/232 |
| 2005/0085042 A1 * | 4/2005 | Chun et al. .................... 438/275 |
| 2005/0139900 A1 * | 6/2005 | Jung et al. ..................... 257/319 |
| 2006/0049449 A1 | 3/2006 | Iino et al. |
| 2006/0088967 A1 * | 4/2006 | Hsiao et al. ................... 438/296 |
| 2006/0113547 A1 * | 6/2006 | Shin ................................ 257/77 |
| 2006/0128099 A1 * | 6/2006 | Kim et al. ..................... 438/258 |
| 2006/0202263 A1 * | 9/2006 | Lee ................................ 257/330 |
| 2006/0246666 A1 * | 11/2006 | Han et al. ...................... 438/263 |

(Continued)

FOREIGN PATENT DOCUMENTS

JP          2005-26589          1/2005

(Continued)

*Primary Examiner* — Matthew Landau
*Assistant Examiner* — Joseph C Nicely
(74) *Attorney, Agent, or Firm* — Oblon, Spivak, McClelland, Maier & Neustadt, L.L.P.

(57) ABSTRACT

A semiconductor device of an example of the invention comprises a memory cell and a select gate transistor provided for the memory cell. A gate electrode of the select gate transistor has a Tri-gate structure in which an upper surface of a gate insulating film formed above a channel of the select gate transistor is set higher than a portion of an upper surface of an element isolation region of the select gate transistor.

4 Claims, 11 Drawing Sheets

U.S. PATENT DOCUMENTS

| | | | |
|---|---|---|---|
| 2007/0023815 A1* | 2/2007 | Oh et al. | 257/314 |
| 2007/0238290 A1* | 10/2007 | Miwa | 438/671 |
| 2007/0290253 A1 | 12/2007 | Kito et al. | |
| 2008/0057644 A1 | 3/2008 | Kwak et al. | |
| 2009/0011560 A1* | 1/2009 | Aritome | 438/257 |
| 2010/0103736 A1* | 4/2010 | Kamigaichi et al. | 365/185.05 |
| 2011/0024827 A1* | 2/2011 | Arai et al. | 257/326 |
| 2011/0212589 A1* | 9/2011 | Matsuo et al. | 438/294 |
| 2011/0215375 A1* | 9/2011 | Cook et al. | 257/190 |

FOREIGN PATENT DOCUMENTS

| | | |
|---|---|---|
| JP | 2006-73939 | 3/2006 |

* cited by examiner

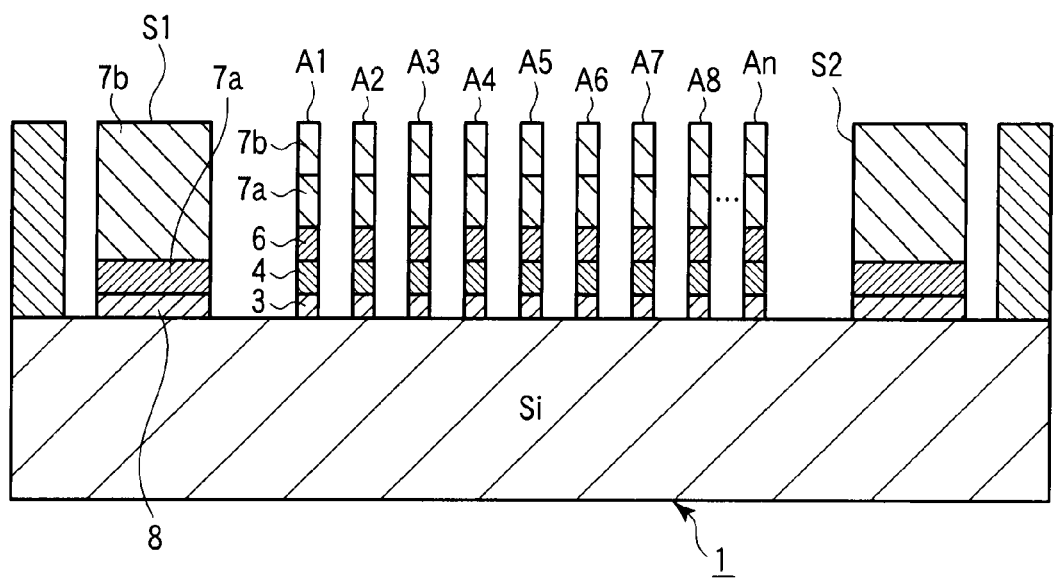
F I G. 1A
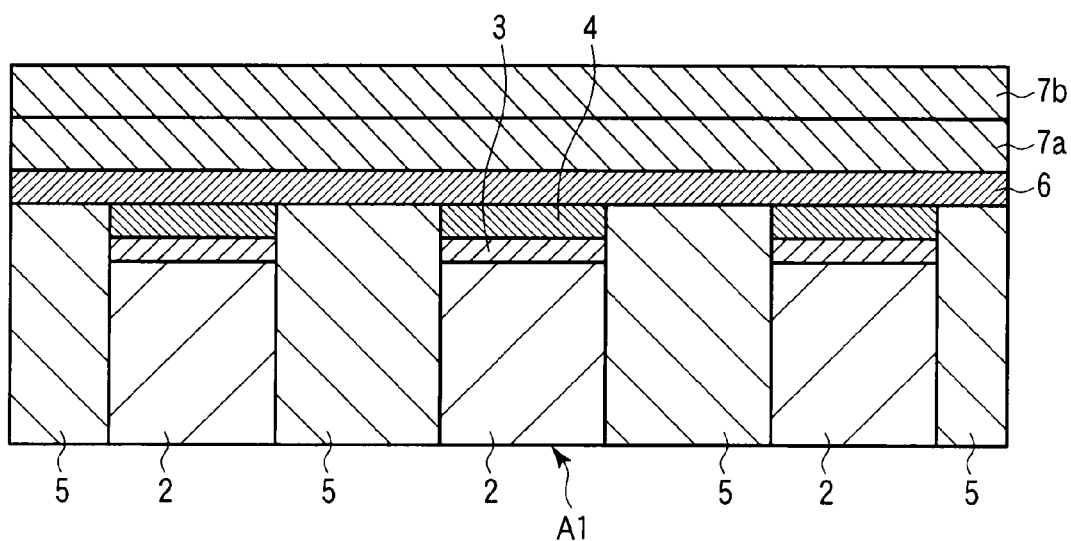
F I G. 1B

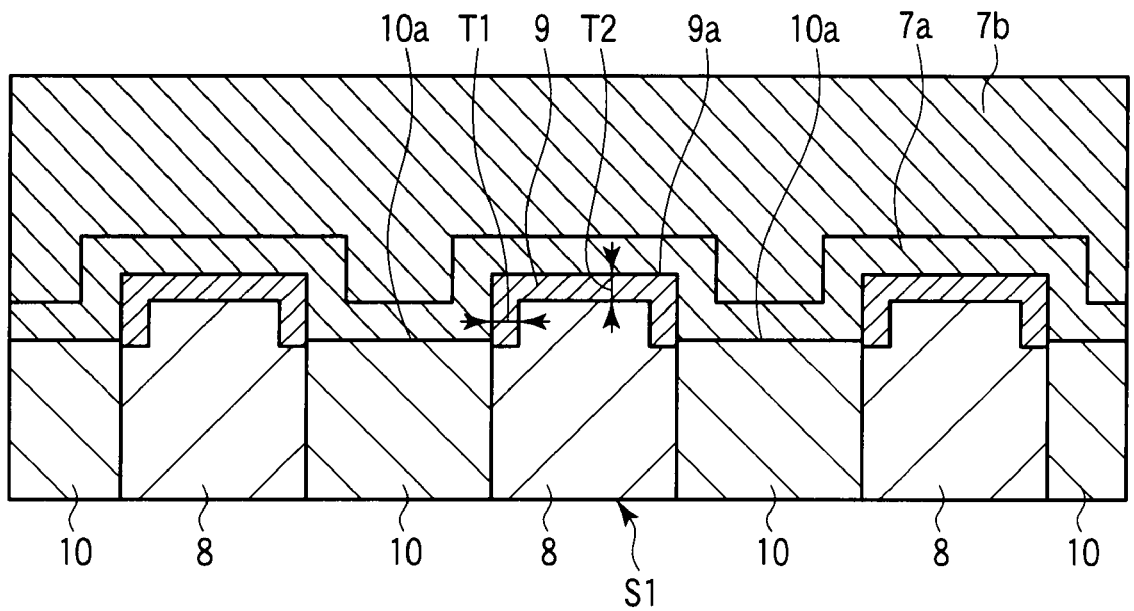
F I G. 2A
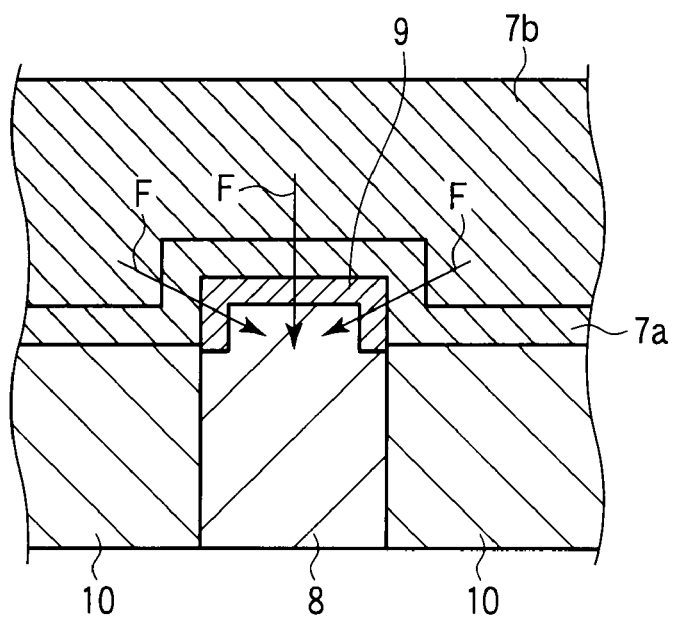
F I G. 2B

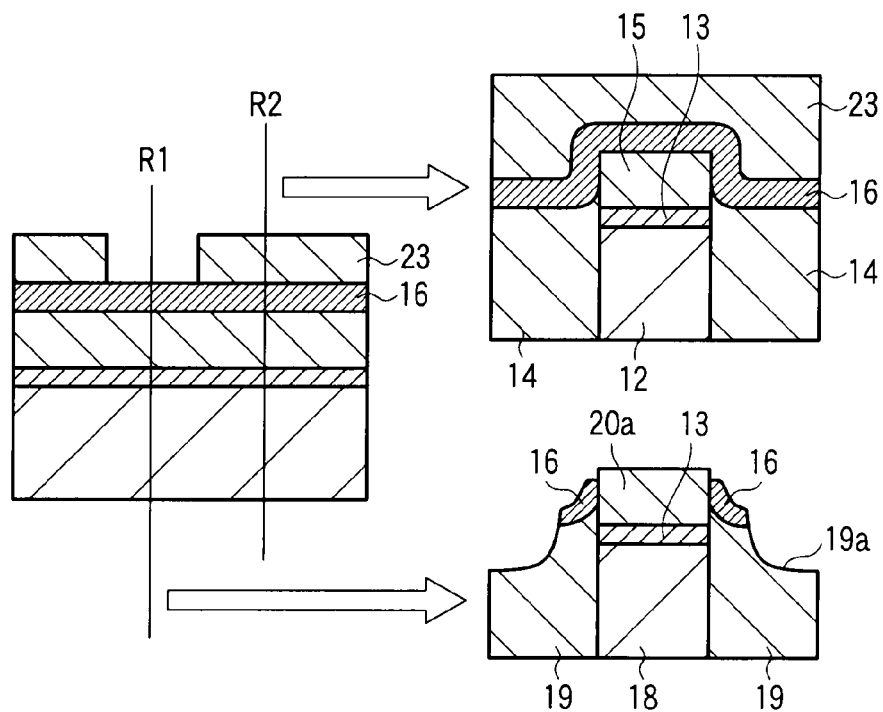
F I G. 9A
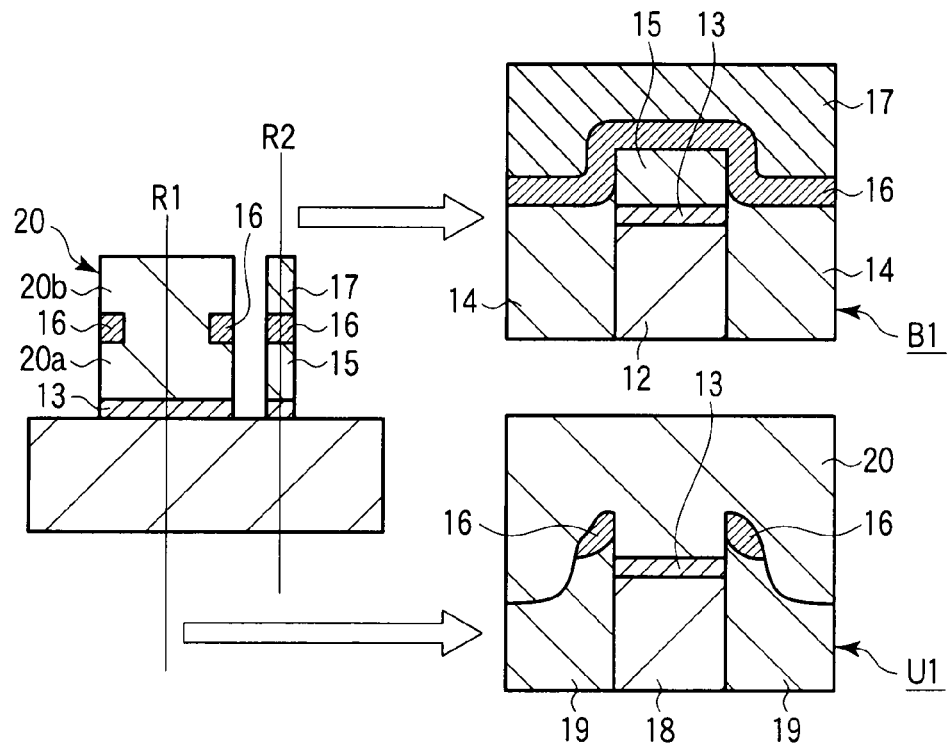
F I G. 9B

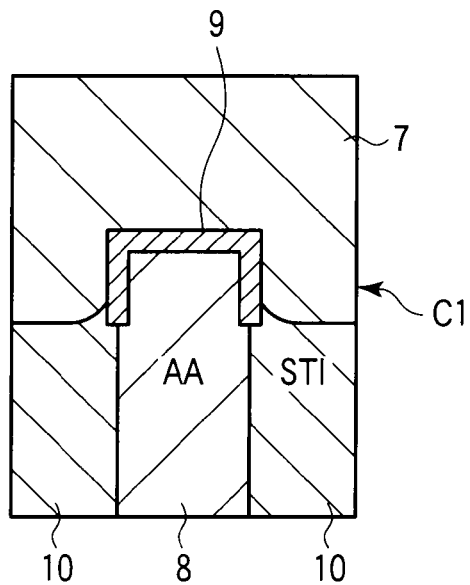
F I G. 10A
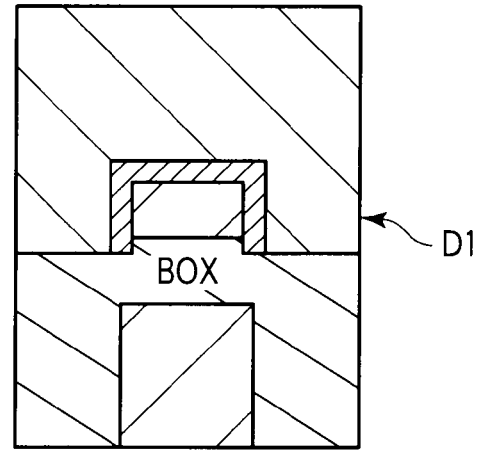
F I G. 10B
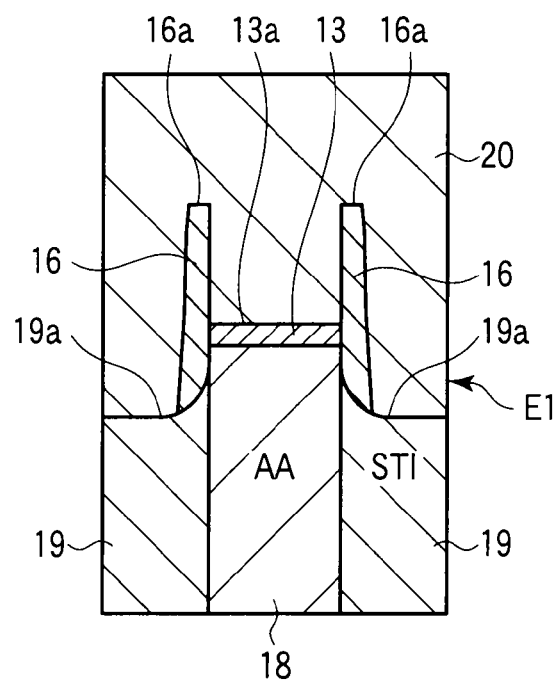
F I G. 10C
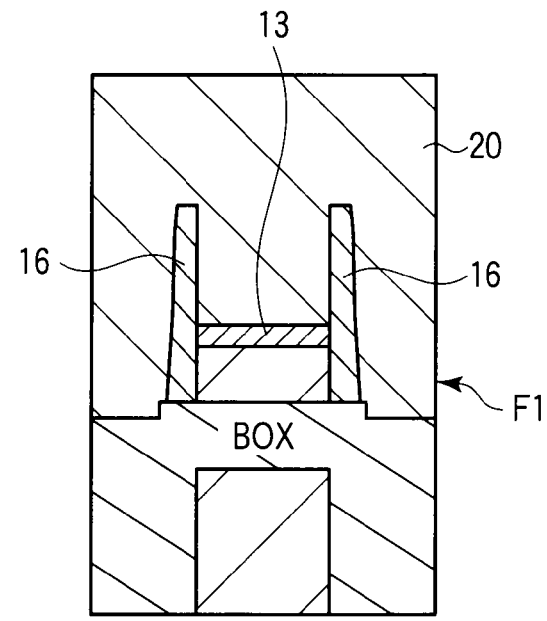
F I G. 10D

SEMICONDUCTOR DEVICE HAVING TRI-GATE STRUCTURE AND MANUFACTURING METHOD THEREOF

CROSS-REFERENCE TO RELATED APPLICATIONS

This application is based upon and claims the benefit of priority from prior Japanese Patent Application No. 2008-134580, filed May 22, 2008, the entire contents of which are incorporated herein by reference.

BACKGROUND

In Document 1 (JP2005-26589), a semiconductor memory device and a manufacturing method thereof that make it possible to make a gate insulating film of a peripheral circuit portion thinner than a gate insulating film of a cell portion and miniaturize select transistors in the memory cell column are disclosed.

In Document 2 (JP2006-73939), a nonvolatile semiconductor memory device having a plurality of memory cell transistors arranged in a matrix form above an insulating layer is described. In Document 2, each memory cell transistor is a depletion MIS transistor having source and drain regions of a first conductivity type that are opposed to each other and arranged above the insulating layer, a channel region of the first conductivity type disposed between the source and drain regions and having an impurity concentration lower than the source and drain regions, a floating gate electrode insulatively arranged above the channel region and a control gate electrode insulatively arranged above the floating gate electrode.

Conventionally, when a value stored in a memory cell having the floating gate and control gate is read in a nonvolatile semiconductor memory device such as a NAND flash memory, for example, a select gate transistor provided for the memory cell is turned on and the value stored in the memory cell is determined based on a state in which the potential of the memory cell is propagated or not.

In the conventional planar type select gate transistor, the controllability of the select gate transistor may be degraded because of shortening of a channel length, the resistance may be made high because of an effect of a channel width, the drivability may be reduced and the selectivity may be degraded. In such a case, it may become difficult to sense the memory cell.

SUMMARY

A semiconductor device of a first example of this invention comprises a memory cell and a select gate transistor provided for the memory cell. A gate electrode of the select gate transistor has a Tri-gate structure in which an upper surface of a gate insulating film formed above a channel of the select gate transistor is set higher than a portion of an upper surface of an element isolation region of the select gate transistor.

In a second example of this invention, a manufacturing method of a semiconductor device including a select gate transistor having a Tri-gate structure, comprises: forming a first element isolation region and first semiconductor region in a select gate formation region of a substrate and forming a second element isolation region and second semiconductor region in a word line formation region of the substrate; sequentially forming a tunnel insulating film, charge storage layer and block film in the select gate formation region and in the word line formation region; removing the tunnel insulating film, charge storage layer and block film in the select gate formation region and removing an insulating film in the first element isolation region to set an upper surface of the first semiconductor region higher than an upper surface of the first element isolation region; forming the gate insulating layer of the select gate transistor above the first semiconductor region to set an upper surface of the gate insulating layer of the select gate transistor higher than the upper surface of the first element isolation region; and depositing a gate electrode layer in the select gate formation region and in the word line formation region.

In a third example of this invention, a manufacturing method of a semiconductor device including a select gate transistor having a Tri-gate structure, comprises: forming a first element isolation region and first semiconductor region in a select gate formation region of a substrate and forming a second element isolation region and second semiconductor region in a word line formation region of the substrate; sequentially forming a gate insulating film and floating gate electrode layer in the first and second semiconductor regions; depositing an inter electrode insulating film in the select gate formation region and in the word line formation region; removing a portion of the inter electrode insulating film in the select gate formation region, recessing a portion of the first element isolation region in the select gate formation region that does not contact the first semiconductor region and forming a projecting portion whose upper surface is set higher than an upper surface of the gate insulating film and that contacts a side surface of the semiconductor region; and depositing a control gate electrode layer in the select gate formation region and in the word line formation region.

BRIEF DESCRIPTION OF THE SEVERAL OF THE DRAWING

FIG. 1A is a cross-sectional view showing one example of a structure of a semiconductor device of a first embodiment of this invention.

FIG. 1B is a cross-sectional view showing one example of a structure of a memory cell A1 of the first embodiment.

FIG. 2A is a cross-sectional view showing one example of a structure of a select gate transistor of the first embodiment.

FIG. 2B is a cross-sectional view showing one example of a state of electric lines of force in the select gate transistor of the semiconductor device of the first embodiment.

FIG. 9A is a cross-sectional view showing one example of a third state of the memory cell and select gate transistor in the manufacturing process of the semiconductor device of the fourth embodiment.

FIG. 9B is a cross-sectional view showing one example of a fourth state of the memory cell and select gate transistor in the manufacturing process of the semiconductor device of the fourth embodiment.

FIG. 10A is a cross-sectional view showing a first example of a semiconductor device having a select gate transistor of the Tri-gate structure of a fifth embodiment of this invention.

FIG. 10B is a cross-sectional view showing a second example of the semiconductor device having the select gate transistor of the Tri-gate structure of the fifth embodiment.

FIG. 10C is a cross-sectional view showing a third example of the semiconductor device having the select gate transistor of the Tri-gate structure of the fifth embodiment.

FIG. 10D is a cross-sectional view showing a fourth example of the semiconductor device having the select gate transistor of the Tri-gate structure of the fifth embodiment.

DETAILED DESCRIPTION OF THE INVENTION

Figure 3A:
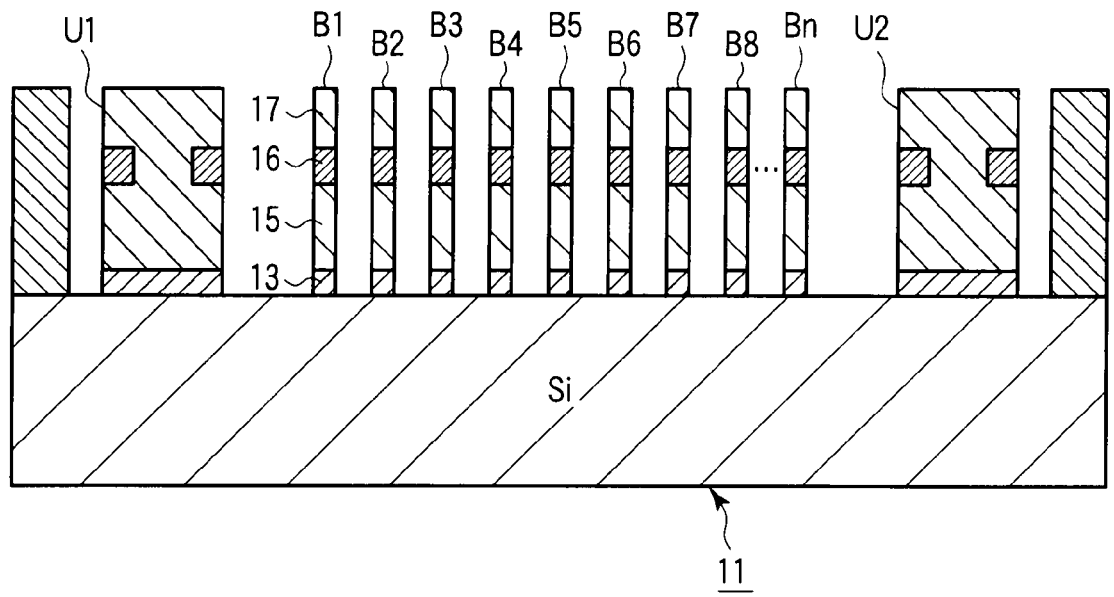
FIG. 3A is a cross-sectional view showing one example of a structure of a semiconductor device of a second embodiment of this invention.

There will now be described embodiments of the present invention with reference to the accompanying drawings. In the drawings, the same symbols are attached to like portions and the explanation thereof is omitted.

First Embodiment

In this embodiment, a semiconductor device in which two select gate transistors are provided on both ends of each row (or column) of a plurality of nonvolatile memory cells and structures each having a combination of the plural memory cells and two select gate transistors are arranged in parallel is explained. In this case, if the memory cell can be made selectable, one select gate transistor may be provided without causing any problem. In this embodiment, A gate electrode of at least one select gate transistor has a Tri-gate structure. Further, in this embodiment, the memory cell may be formed with the Tri-gate structure or only gate electrode of the select gate transistor among the memory cell and select gate transistor may have the Tri-gate structure.

FIG. 1A is a cross-sectional view showing one example of a structure of a semiconductor device of this embodiment.

A semiconductor device 1 of FIG. 1A is a NAND cell structure including charge-trap memory cells and select gate transistors. FIG. 1A is a cross-sectional view taken along a direction perpendicular to a substrate and extending in a bit line direction (in a direction connecting the select gate transistors).

The semiconductor device 1 has select gate transistors S1, S2 with the Tri-gate structure arranged on both ends of memory cells A1 to An arranged side by side in a row direction among a plurality of memory cells arranged in a matrix form. In this embodiment, it is assumed that a Bulk-Si substrate is provided under the select gate transistors S1, S2.

FIG. 1B is a cross-sectional view showing one example of a structure of the memory cell A1. FIG. 1B is a cross-sectional view taken along a direction perpendicular to the substrate and extending in a word line direction (in a direction perpendicular to the bit line direction). The other memory cells may have the same structure as that of the memory cell A1.

Above a semiconductor region (active region) 2, a tunnel insulating film 3 (for example, silicon oxide) is formed. A charge storage layer 4 (for example, silicon nitride) is formed above a tunnel insulating film 3.

For both side surfaces of the semiconductor region 2, tunnel insulating film 3 and charge storage layer 4 of a laminated state, an element isolation region (element separation region) 5 is formed to sandwich the semiconductor region 2, tunnel insulating film 3 and charge storage layer 4 of the laminated state. For example, the element isolation region 5 may be an element isolation region formed by use of a shallow trench isolation technique.

A block film 6 (for example, aluminum oxide) is formed above the charge storage layers 4 and element isolation regions 5.

Gate electrode layers 7a, 7b (for example, poly-Si) are formed above the block film 6.

FIG. 2A is a cross-sectional view showing one example of a structure of the select gate transistor S1. FIG. 2A is a cross-sectional view of the semiconductor device 1 taken along the direction perpendicular to the substrate and extending in a direction parallel to the word line direction. The other select gate transistors such as the select gate transistor S2 may have the same structure as that of the select gate transistor S1.

As described above, the select gate transistor S1 has the Tri-gate structure. The gate insulating film/gate interface above the channel of the select gate transistor S1 is set higher than an upper surface of the element isolation region.

Specifically, an upper surface of semiconductor region 8 of the select gate transistor S1 is formed in a convex shape in the cross section parallel to the word line direction.

A gate insulating film 9 of an inverted concave shape formed by gate oxidation, for example, is formed above the convex-shaped upper surface of the semiconductor region 8. That is, the convex-shaped upper surface of the semiconductor region 8 is covered with the gate insulating film 9.

An element isolation region 10 is formed for both side surfaces of the semiconductor region 8 to sandwich the semiconductor region 8.

Gate electrode layers 7a, 7b are formed above the gate insulating film 9 and the element isolation region 10. As a result, the upper surface of the element isolation region 10 and a portion of the upper surface and both side surfaces of the inverted concave-shaped gate insulating film 9 that lies above the upper surface of the element isolation region 10 are covered with the gate electrode layer 7a.

The select gate transistor S1 of this embodiment has a structure in which an upper surface 9a of the gate insulating film 9 formed above the channel of the select gate transistor S1 is set higher than an upper surface 10a of the element isolation region 10 of the select gate transistor S1.

FIG. 2B is a cross-sectional view showing one example of a state of electric lines of force in the select gate transistor S1 of the semiconductor device 1 of this embodiment.

Since the select gate transistor S1 has the Tri-gate structure, the electric lines of force F are generated in a direction from the gate electrode layers 7a, 7b toward an upper surface of a projecting portion of the semiconductor region 8 via the upper surface portion of the gate insulating film 9 and in directions from the gate electrode layers 7a, 7b toward the side surfaces of the projecting portion of the semiconductor region 8 via the side surface portions of the gate insulating film 9.

The intensity of an electric field applied to the channel is increased and the controllability by the gate for the channel can be enhanced by forming the gate insulating film 9 to surround the side surfaces of the projecting portion of the upper surface of the semiconductor region 8. Then, a current amount can be increased and the resistance can be reduced by using the side surfaces of the projecting portion of the upper surface of the semiconductor region 8 as a channel.

It is preferable that the intensity of the electric field generated in a direction toward the semiconductor region 8 via the side portions of the gate insulating film 9 will not exceed the intensity of the electric field generated in a direction toward the semiconductor region 8 via the upper surface portion of the gate insulating film 9. Further, from the viewpoint of reducing the resistance, it is preferable that the thickness T1 of the side portion of the gate insulating film 9 be set in a range not smaller than the thickness T2 of the upper surface portion of the gate insulating film 9 and not larger than twice the above thickness, being set as small as possible. For example, when the thickness T2 is set to approximately 5 to 15 nm, it is preferable to set the thickness T1 to approximately 5 to 15 nm, for example.

In this embodiment, the controllability by the select gate transistors S1, S2 can be enhanced without increasing the gate length of the select gate transistors S1, S2.

In this embodiment, the gate controllability of the select gate transistors S1, S2 can be increased and the cut-off characteristic can be improved. Further, a reduction in the resistance can be realized by increasing the effective channel width.

Second Embodiment

In this embodiment, a case wherein a select gate transistor of a floating-gate NAND flash memory comprising a floating gate and control gate is formed with the Tri-gate structure is explained.

FIG. 3A is a cross-sectional view showing one example of a structure of a semiconductor device of this embodiment.

A semiconductor device 11 of FIG. 3A is a NAND cell structure including floating-gate memory cells and select gate transistors. FIG. 3A is a cross-sectional view taken along a direction perpendicular to a substrate and extending in a bit line direction.

The semiconductor device 11 has select gate transistors U1, U2 with the Tri-gate structure arranged on both ends of memory cells B1 to Bn arranged side by side in a row direction among a plurality of memory cells arranged in a matrix form. In this embodiment, it is assumed that a bulk-Si substrate is provided under the select gate transistors U1, U2.

Figure 3B:
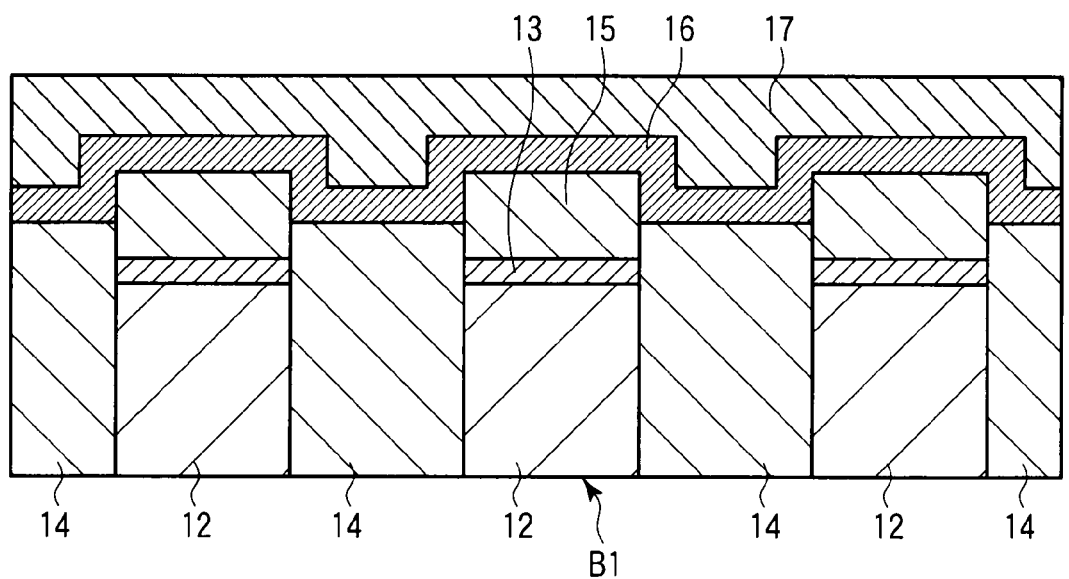
FIG. 3B is a cross-sectional view showing one example of a structure of a memory cell of the second embodiment.

FIG. 3B is a cross-sectional view showing one example of a structure of the memory cell B1. FIG. 3B is a cross-sectional view taken along a direction perpendicular to the substrate and extending in a word line direction. The other memory cells have the same structure as that of the memory cell B1.

A gate insulating film 13 is formed above the semiconductor region 12.

An element isolation region 14 is formed on both side surfaces of the semiconductor region 12.

A floating gate electrode layer 15 (for example, poly-Si) is formed above the gate insulating film 13.

An inter electrode insulating film (Inter poly insulating film: for example, a silicon oxide film or silicon nitride film) 16 is formed above the element isolation region 14 and a floating gate electrode layer 15. As a result, an upper surface of the element isolation region 14 and a portion of an upper surface and both side surfaces of the floating gate electrode layer 15 that lies above an upper surface of the element isolation region 14 are covered with the inter electrode insulating film 16.

A control gate electrode layer 17 is formed above the inter electrode insulating film 16.

Figure 4A:
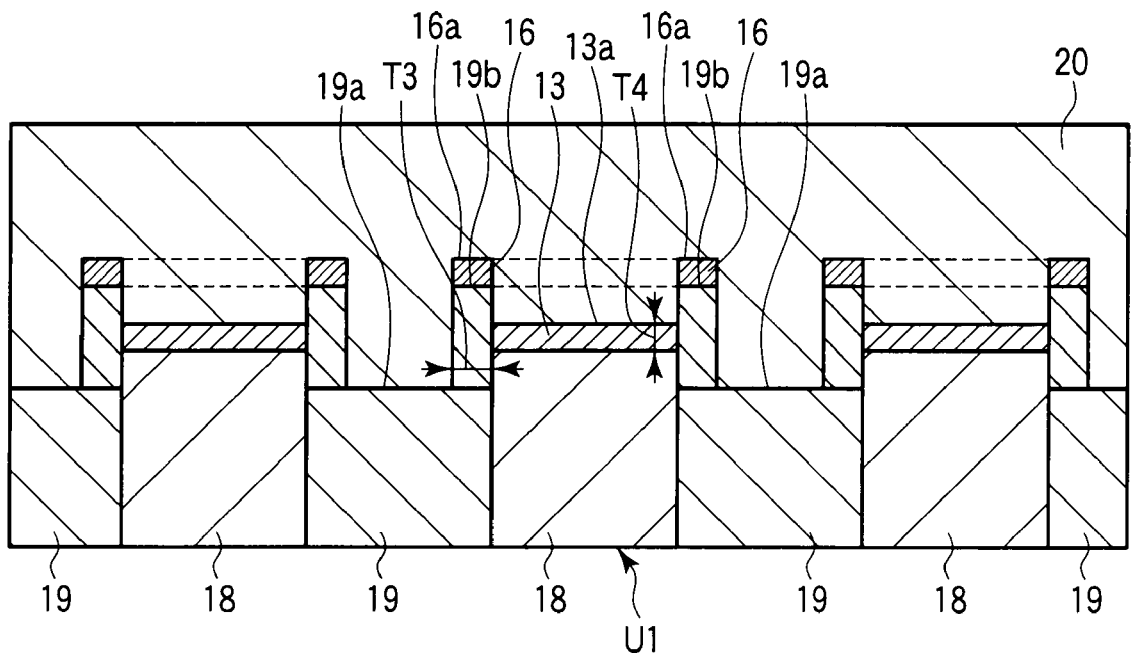
FIG. 4A is a cross-sectional view showing one example of a structure of a select gate transistor of the second embodiment.

FIG. 4A is a cross-sectional view showing one example of a structure of the select gate transistor U1. FIG. 4A is a cross-sectional view of the semiconductor device 11 taken along a direction perpendicular to the substrate and extending in a direction parallel to the word line direction. The other select gate transistors such as the select gate transistor U2 can be formed with the same structure as that of the select gate transistor U1.

As described above, A gate electrode of the select gate transistor U1 has the Tri-gate structure. A gate insulating film/gate interface above the channel of the select gate transistor U1 is set higher than an upper interface of the element isolation region that is separated from the channel.

Specifically, the gate insulating film 13 is formed above the semiconductor region 18 in the cross section in the word line direction.

An element isolation region 19 is formed on both side surfaces of the semiconductor region 18 to sandwich the semiconductor region 18.

An upper surface 19a of a bottom portion of the element isolation region 19 that does not contact the side surfaces of the semiconductor region 18 among an upper surface of the element isolation region 19 is recessed so as to be set lower than the upper surface 13a of the gate insulating film 13.

For example, an inter electrode insulating film 16 is formed above an upper surface 19b of a portion of the element isolation region 19 that contact the side surfaces of the semiconductor region 18. In this case, the inter electrode insulating films 16 can be omitted.

The upper surface 19b of the portion of the element isolation region 19 that contact the side surfaces of the semiconductor region 18 or an upper surface 16a of the inter electrode insulating film 16 are placed above an upper surface 13a of the gate insulating film 13.

A gate electrode layer 20 is formed above the element isolation region 19, inter electrode insulating film 16 and gate insulating film 13. A lower-layer side portion of the gate electrode layer 20 is formed at a time of formation of the floating gate electrode layer 15 of the memory cell, for example. The upper-layer side portion of the gate electrode layer 20 is formed at a time of formation of the control gate electrode layer 17 of the memory cell, for example.

The upper surface 13a of the gate insulating film 13 formed above the channel of the select gate transistor U1 in this embodiment is set higher than part of the upper surface 19a of the element isolation region 19 of the select gate transistor U1.

Figure 4B:
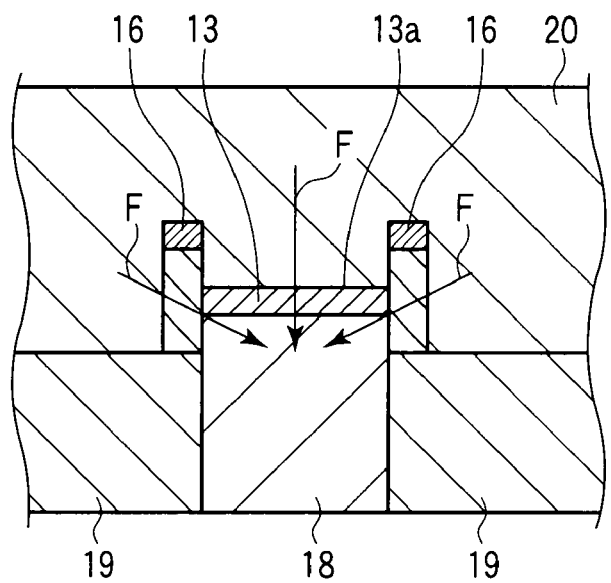
FIG. 4B is a cross-sectional view showing one example of a state of electric lines of force in the select gate transistor of the semiconductor device of the second embodiment.

FIG. 4B is a cross-sectional view showing one example of a state of electric lines of force in the select gate transistor U1 of the semiconductor device 11 of this embodiment.

Since the select gate transistor U1 has the Tri-gate structure, the electric lines of force F are generated in a direction from the gate electrode layer 20 toward the semiconductor region 18 via the gate insulating film 13 and in a direction from the gate electrode layer 20 toward side surfaces of the upper portion of the semiconductor region 18 that lies above the recessed portion of the element isolation region 19 via the projecting portion of the element isolation region 19 that contact the side surfaces of the semiconductor region 18.

The intensity of an electric field applied to the channel is increased and the controllability for the channel by the gate can be enhanced by forming the projecting portion of the element isolation regions 19 to surround the side surfaces of the projecting portion of the upper surface of the semiconductor region 18. Then, a current amount can be increased and the resistance can be reduced by using the side surfaces of the projecting portion of the upper surface of the semiconductor region 18 as a channel.

It is preferable that the intensity of the electric field generated in a direction toward the semiconductor region 18 via the projecting portion of the element isolation region 19 will not exceed the intensity of the electric field generated in a direction toward the semiconductor region 18 via the gate insulating film 8. Further, from the viewpoint of reducing the resistance, it is preferable that the thickness T3 of the projecting portion of the element isolation region 19 be set in a range not smaller than the thickness T4 of the gate insulating film 13 and not larger than twice the thickness T4 of the gate insulating film 13, being set as small as possible. In addition, it is preferable that the thickness T3 of the projecting portion of the element isolation region 19 be set less than or equal to the thickness of the inter electrode insulating film 16 disposed between the floating gate electrode layer 15 and the control gate electrode layer 17 of the memory cell. For example, when the thickness T3 is set to approximately 5 to 15 nm, it is preferable to set the thickness T4 to approximately 5 to 15 nm, for example.

In this embodiment, the controllability of the select gate transistors U1, U2 can be enhanced without increasing the gate length of the select gate transistors U1, U2.

In this embodiment, the gate controllability of the select gate transistors U1, U2 can be increased and the cut-off characteristic can be improved. Further, a reduction in the resistance can be realized by increasing the effective channel width.

Third Embodiment

In this embodiment, a manufacturing method of the select gate transistor S1 in the first embodiment is explained. In this embodiment, a case wherein a bulk-Si substrate is provided under the select gate transistor S1 and the charge storage layer has a MONOS structure is explained. In this embodiment, the charge storage layer is a charge trap insulating film, for example.

FIG. 5A to FIG. 7 are cross-sectional views showing one example of a manufacturing process of the memory cell A1 and select gate transistor S1.

Figure 5A:
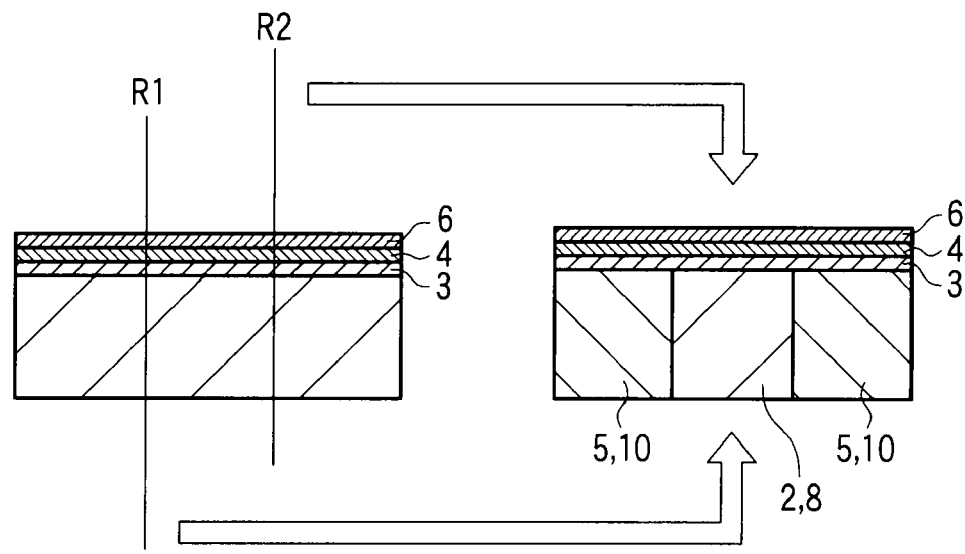
FIG. 5A is a cross-sectional view showing one example of a first state of a memory cell and select gate transistor in a manufacturing process of a semiconductor device of a third embodiment of this invention.

In this embodiment, first, as shown in FIG. 5A, a semiconductor region 8 and an element isolation region 10 are formed in a formation region R1 for the select gate transistor S1 and a semiconductor region 2 and an element isolation region 5 are formed in a formation region (formation region for the memory cell A1) R2 for a word line. Then, a tunnel insulating film (for example, silicon oxide) 3, charge storage layer (for example, silicon nitride) 4 and block film (for example, aluminum oxide) 6 are formed in the select gate formation region R1 and word line formation region R2.

Figure 5B:
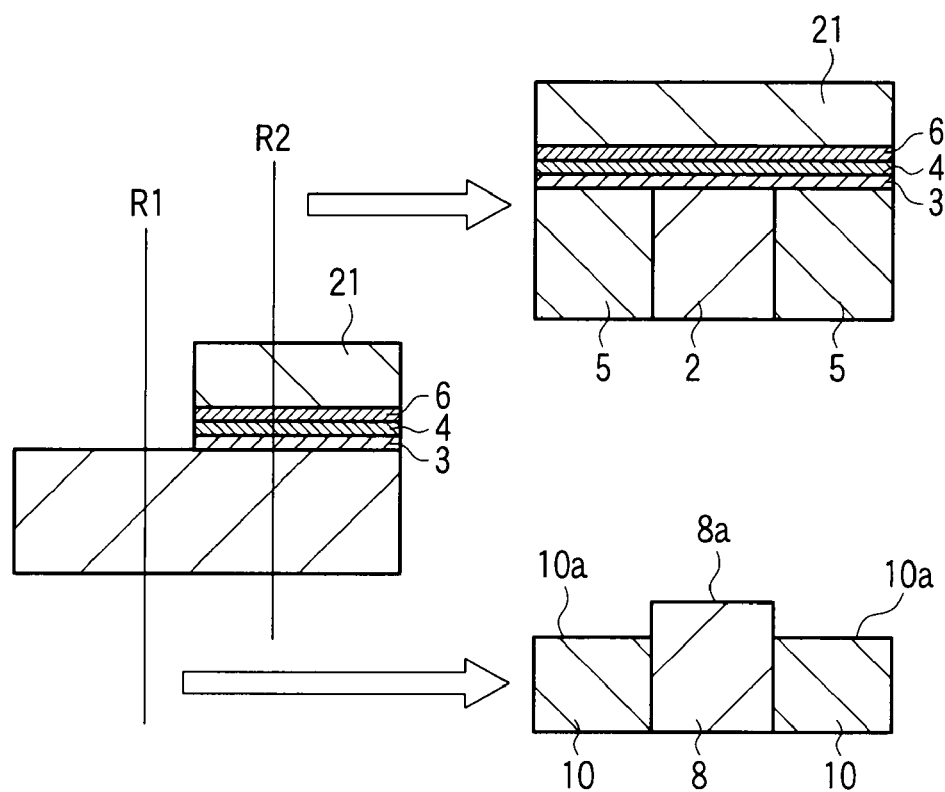
FIG. 5B is a cross-sectional view showing one example of a second state of the memory cell and select gate transistor in the manufacturing process of the semiconductor device of the third embodiment.

Next, as shown in FIG. 5B, a mask 21 is used to remove the tunnel insulating film 3, charge storage layer 4 and block film 6 in the select gate formation region R1. At the film removal time, an over-etching process is performed to remove the insulating film of the element isolation region 10. As a result, the upper surface 8a of the semiconductor region 8 becomes higher than the upper surface 10a of the element isolation region 10 in the select gate formation region R1.

Figure 6A:
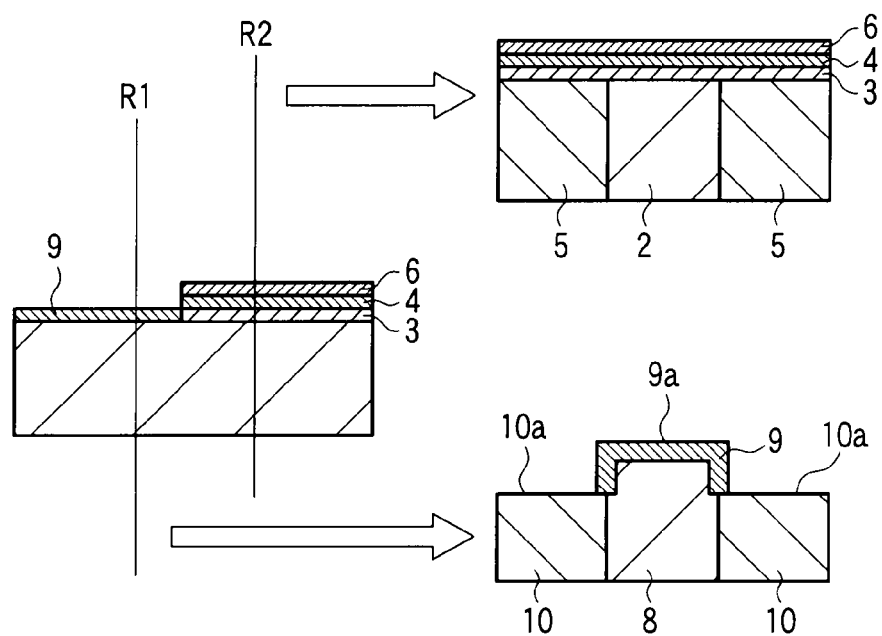
FIG. 6A is a cross-sectional view showing one example of a third state of the memory cell and select gate transistor in the manufacturing process of the semiconductor device of the third embodiment.

Next, as shown in FIG. 6A, for example, the surface of the semiconductor region 8 that lies above the upper surface 10a of the element isolation region 10 is subjected to gate oxidation to form a gate insulating film 9 for the select gate transistor S1 and the mask 21 is removed. As a result, the upper surface 9a of the gate insulating film 9 becomes higher than the upper surface 10a of the element isolation region 10 in the select gate formation region R1.

Figure 6B:
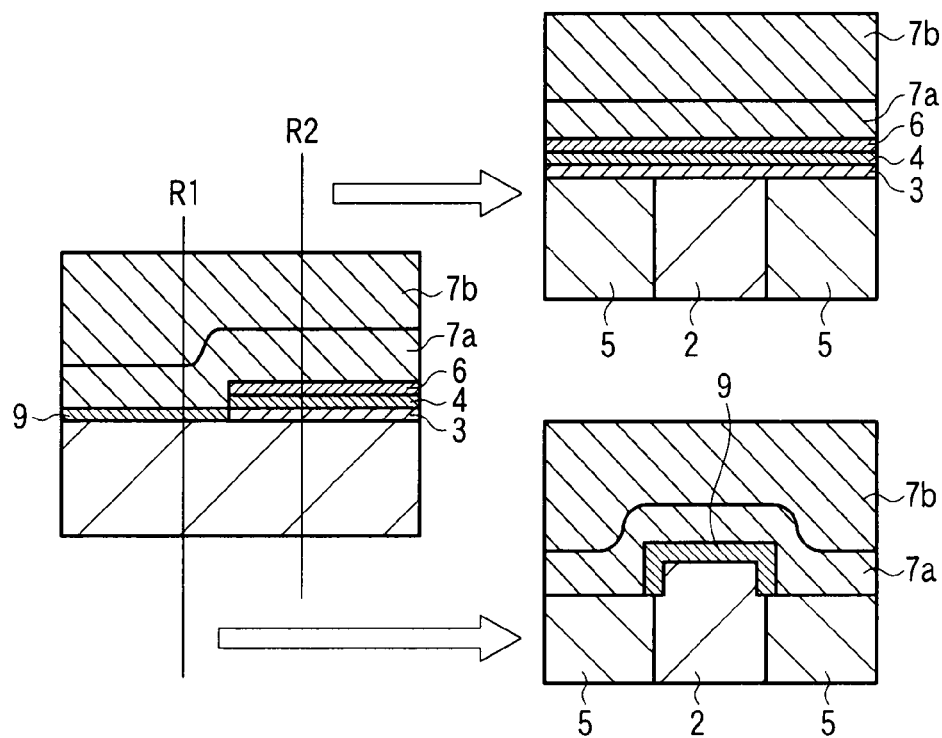
FIG. 6B is a cross-sectional view showing one example of a fourth state of the memory cell and select gate transistor in the manufacturing process of the semiconductor device of the third embodiment.

Next, as shown in FIG. 6B, the gate electrode layers 7a, 7b, for example poly-Si, are deposited in the select gate formation region R1 and word line formation region R2.

Figure 7:
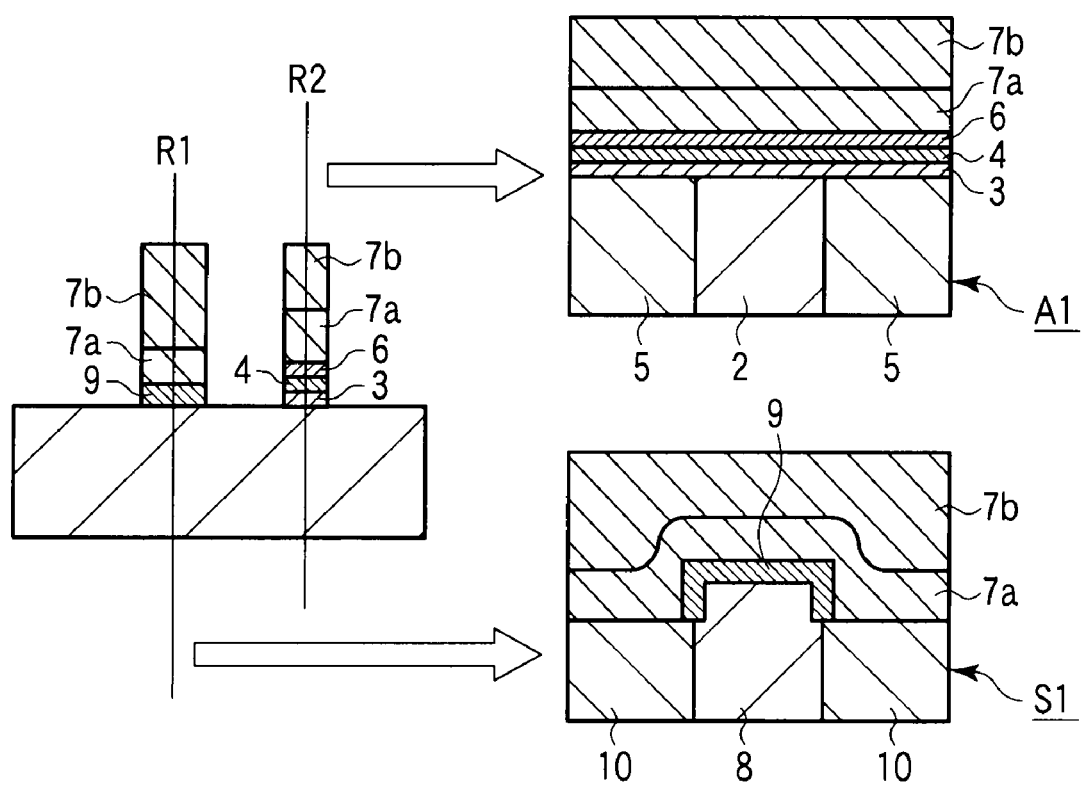
FIG. 7 is a cross-sectional view showing one example of a second state of the memory cell and select gate transistor in the manufacturing process of the semiconductor device of the third embodiment.

After this, as shown in FIG. 7, the select gate transistor S1 and memory cell A1 are formed.

Fourth Embodiment

In this embodiment, a manufacturing method of the select gate transistor U1 in the second embodiment is explained. In this embodiment, a case wherein a bulk-Si substrate is provided under the select gate transistor U1 and the charge storage layer is a floating gate electrode layer 15 of poly-Si, for example, is explained.

FIG. 8A to FIG. 9B are cross-sectional views showing one example of a manufacturing process of the memory cell B1 and select gate transistor U1.

Figure 8A:
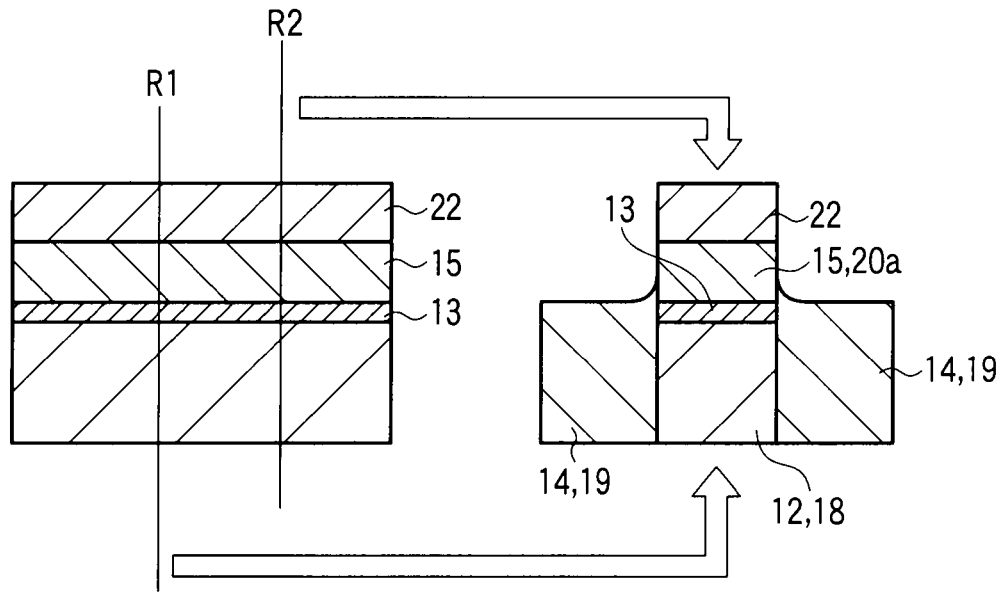
FIG. 8A is a cross-sectional view showing one example of a first state of a memory cell and select gate transistor in a manufacturing process of a semiconductor device of a fourth embodiment of this invention.

In this embodiment, first, as shown in FIG. 8A, a semiconductor region 18 and an element isolation region 19 are formed in a formation region R1 for the select gate transistor U1 and a semiconductor region 12 and an element isolation region 14 are formed in a formation region R2 for a word line. Then, a gate insulating film 13, floating gate electrode layer 15 (corresponding to a lower layer 20a of a gate electrode layer 20 of the select gate transistor U1) and mask insulating film (SiN film) 22 are sequentially formed above the upper surfaces of the semiconductor regions 12, 18.

The thickness of the element isolation regions 14, 19 is set to approximately 200 to 300 nm.

The gate insulating film 13 is formed by oxidization to the thickness of approximately 5 to 15 nm.

The floating gate electrode layer 15 (the lower layer 20a of the gate electrode layer 20 of the select gate transistor U1) is formed with the thickness of approximately 50 to 100 nm. As the floating gate electrode layer 15, for example, poly-Si is used.

Figure 8B:
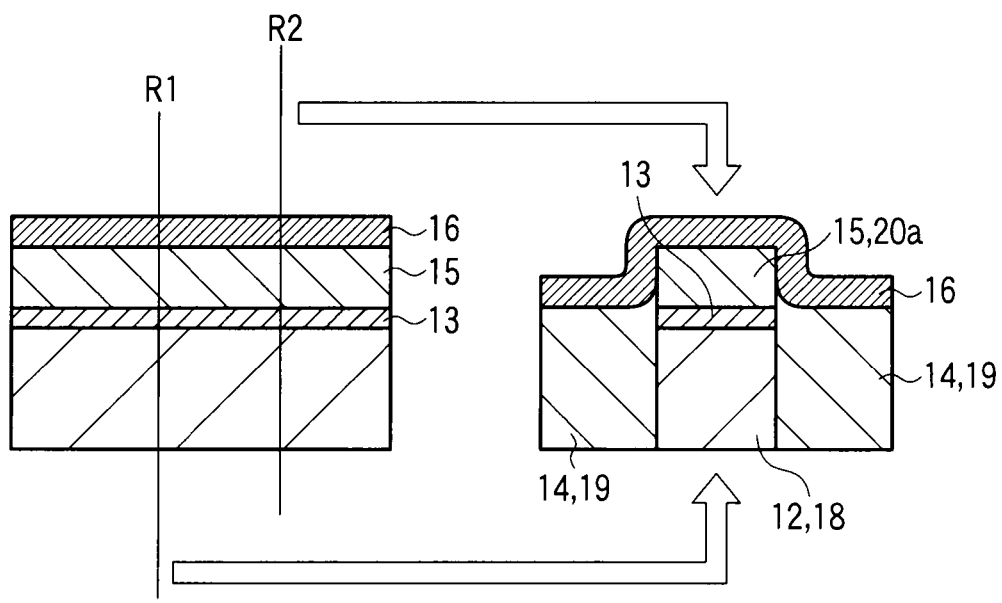
FIG. 8B is a cross-sectional view showing one example of a second state of the memory cell and select gate transistor in the manufacturing process of the semiconductor device of the fourth embodiment.

Next, as shown in FIG. 8B, the mask insulating film 22 is removed and an inter electrode insulating film (Inter poly insulating film, for example, silicon oxide film) 16 is deposited.

The thickness of the inter electrode insulating film 16 is set to approximately 5 to 15 nm.

Next, as shown in FIG. 9A, a portion or whole portion of the inter electrode insulating film 16 above the select gate transistor U1 is removed by using a mask 23, and an over-etching process is performed to recess a portion of the insulating film of the element isolation regions 19 (a portion of the element isolation region 19 that do not contact the semiconductor region 18) for the floating gate electrode layer 15 (corresponding to the lower layer 20a of the gate electrode layer 20) is electrically connected to a control gate electrode layer 17 (corresponding to an upper layer 20b of the gate electrode layer 20) in the select gate formation region R1.

An insulating film consisting of an impurity is formed above the upper surfaces 19a of an over-etched portion of the element isolation regions 19.

In this case, the mask 23 is formed with the thickness of approximately 50 to 100 nm.

Then, as shown in FIG. 9B, a control gate electrode layer 17 (corresponding to the upper layer 20b of the gate electrode layer 20, for example, poly-Si) is deposited in the select gate formation region R1 and word line formation region R2 to form the select gate U1 and memory cell B1.

Fifth Embodiment

In this embodiment, modifications of the select gate with the Tri-gate structure are explained.

In FIG. 10A, a bulk-Si substrate is provided under a select gate transistor C1. FIG. 10A is a cross-sectional view taken along a direction perpendicular to the substrate and extending in a direction parallel to a word line direction.

FIG. 10B is a cross-sectional view of a select gate transistor D1 showing one example of a case wherein the select gate transistor C1 of FIG. 10A is formed above an SOI substrate.

FIG. 10C shows a select gate transistor E1 in which the upper side surfaces of a semiconductor region 18 are covered with the inter electrode insulating film 16 and the gate insulating film 13 is formed above the upper surface of the semiconductor region 18. FIG. 10C is a cross-sectional view taken along a direction perpendicular to the substrate and extending in a direction parallel to a word line direction.

The gate insulating film 13 is formed above the semiconductor region 18.

The element isolation region 19 sandwich the semiconductor region 18 in the lateral direction. The upper surface 19a of the element isolation regions 19 is set lower than the upper surface 13a of the gate insulating film 13. That is, the upper portion of the semiconductor region 18 projects from the element isolation regions 19.

The inter electrode insulating film 16 covers the side surfaces of the semiconductor region 18 that lie above the upper surfaces 19a of the element isolation region 19. The upper surface 16a of the inter electrode insulating film 16 is set higher than the upper surface 13a of the gate insulating film 13.

FIG. 10D is a cross-sectional view of a select gate transistor F1 showing one example of a case wherein the select gate transistor E1 of FIG. 10C is formed above an SOI substrate.

Thus, the select gate transistor with the Tri-gate structure is not necessarily formed above the bulk-Si substrate but may be formed above the SOI substrate.

Sixth Embodiment

In this embodiment, modifications of the first and third embodiments are explained.

Figure 11:
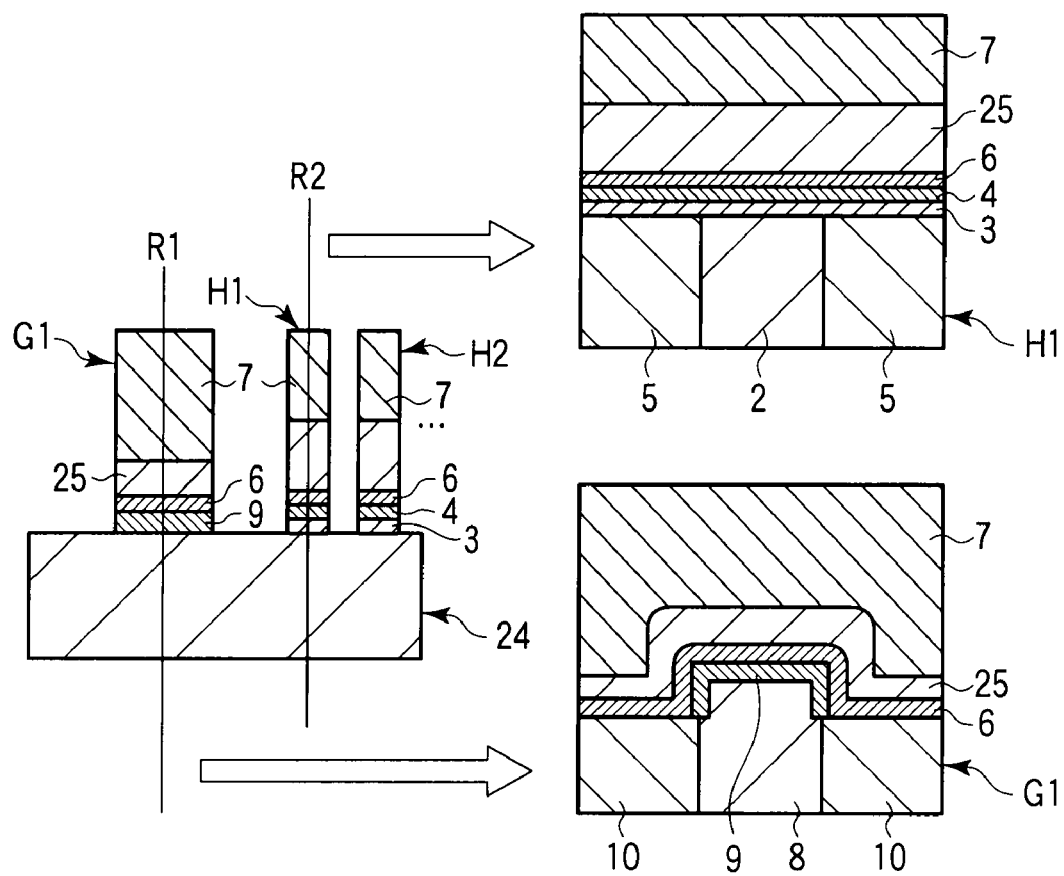
FIG. 11 is a cross-sectional view showing one example of a structure of a semiconductor device of a sixth embodiment of this invention.

FIG. 11 is a cross-sectional view showing one example of the structure of a semiconductor device of this embodiment.

In a semiconductor device 24 of this embodiment, memory cells H1, H2 each include a semiconductor region 2 and an element isolation region 5 that sandwiches the semiconductor region 2 in the cross section taken along a word line direction. Above the upper surfaces of the semiconductor region 2 and element isolation regions 5, a tunnel insulating film 3, charge storage layer 4, block film 6, metal film 25 and gate electrode layer 7 are sequentially deposited from the bottom.

In the semiconductor device 24 of this embodiment, the upper surface of a semiconductor region 8 of a select gate transistor G1 is formed in a convex form in the cross section taken along a direction parallel to the word line direction.

For example, an inverted concave-shaped gate insulating film 9 formed by gate oxidation is formed above the convex-shaped upper surface of the semiconductor region 8. The convex-shaped upper surface of the semiconductor region 8 is covered with the gate insulating film 9. An element isolation region 10 is formed to sandwich the semiconductor region 8 for both side surfaces of the semiconductor region 8 on which the gate insulating film 9 is not formed among the side surfaces of the semiconductor region 8.

The block film 6 is formed above the element isolation region 10 and gate insulating film 9. The metal film 25 and gate electrode layer 7 are sequentially formed above the upper surface of the block film 6 from the bottom.

In the above embodiments, a case of the NAND flash memory is explained as an example but, for example, a NOR flash memory may be used. As the material of the control gate electrode layer 17, a material containing metal (for example, Nisi, W, Ta, CoSi) may be used instead of poly-Si. As the control gate electrode layer 17, a multi-layered film may be used. For example, as the control gate electrode layer 17, a multi-layered film including a poly-Si layer and silicide layer can be used. Further, for example, as the control gate electrode layer 17, a multi-layered film including a metal layer, poly-Si layer and silicide layer sequentially formed from the bottom can be used. As the inter electrode insulating film 16, for example, a multi-layered film including an oxide film, nitride film and oxide film can be used. Further, as the inter electrode insulating film 16, for example, a multi-layered film including a nitride film, oxide film, nitride film, oxide film and nitride film may be used. As the inter electrode insulating film 16, for example, a high-k film of $Al_2O_3$ or $HfO_2$ may be used. As the tunnel insulating film 13, a multi-layered film can be used. As the block film 6, either a multi-layered film or high-k film may be used.

What is claimed is:

1. A semiconductor device comprising:
    a memory cell which does not have a Tri-gate structure; and
    a select gate transistor provided for the memory cell;
    wherein a gate electrode of the select gate transistor has a Tri-gate structure in which an upper surface of a gate insulating film formed above a channel of the select gate transistor is set higher than a portion of an upper surface of an element isolation region of the select gate transistor,
    wherein the select gate transistor includes:
    a semiconductor region;
    the gate insulating film that covers an upper surface of the semiconductor region;
    the element isolation region formed to sandwich the semiconductor region in a lateral direction in a cross section in a direction perpendicular to a substrate, and having a projecting portion whose upper surface is set higher than an upper surface of the gate insulating film and that contacts a side surface of the semiconductor region and a portion whose upper surface is set lower than the upper surface of the gate insulating film and that does not contact the side surface of the semiconductor region; and
    a gate electrode layer formed to cover the element isolation regions and gate insulating film.

2. The device of claim 1,
    wherein a thickness of the projecting portion of the element isolation region is not smaller than a thickness of the gate insulating film, not larger than twice the thickness of the gate insulating film, and not larger than a thickness of an inter electrode insulating film disposed between a floating gate electrode layer and control gate electrode layer of the memory cell.

3. The device of claim 2,
    wherein the thickness of the projecting portion of the element isolation region is set to a value in a range of 5 to 15 nm and the thickness of the gate insulating film is set to a value in a range of 5 to 15 nm.

4. The device of claim 1,
    wherein the select gate transistor is formed above a Bulk-Si substrate or SOI substrate.

* * * * *